United States Patent [19]

Kinzer

[11] Patent Number: 5,023,678
[45] Date of Patent: * Jun. 11, 1991

[54] HIGH POWER MOSFET AND INTEGRATED CONTROL CIRCUIT THEREFOR FOR HIGH-SIDE SWITCH APPLICATION

[75] Inventor: Daniel M. Kinzer, Riverside, Calif.

[73] Assignee: International Rectifier Corporation, El Segundo, Calif.

[*] Notice: The portion of the term of this patent subsequent to Sep. 12, 2006 has been disclaimed.

[21] Appl. No.: 391,487

[22] Filed: Aug. 9, 1989

Related U.S. Application Data

[62] Division of Ser. No. 54,627, May 27, 1987, Pat. No. 4,866,495.

[51] Int. Cl.$^5$ ............................................. H01L 29/78
[52] U.S. Cl. .................................. 357/23.4; 357/23.8; 357/20; 357/38; 357/52; 357/59; 357/86
[58] Field of Search ................. 357/23.4, 23.8, 52, 357/59, 38, 20

[56] References Cited

U.S. PATENT DOCUMENTS

| | | |
|---|---|---|
| 4,152,714 | 5/1979 | Hendrickson et al. . |
| 4,300,150 | 11/1981 | Colak . |
| 4,364,073 | 12/1982 | Becke et al. . |
| 4,376,286 | 3/1983 | Lidow et al. . |
| 4,409,606 | 10/1983 | Wagenaar et al. . |
| 4,422,089 | 12/1983 | Vaes et al. . |
| 4,593,458 | 6/1986 | Adler . |
| 4,609,929 | 9/1986 | Jayaraman et al. . |
| 4,626,879 | 12/1986 | Colak . |
| 4,628,341 | 12/1986 | Thomas . |
| 4,639,761 | 1/1987 | Singer et al. . |
| 4,742,380 | 5/1988 | Chang . |
| 4,866,495 | 9/1989 | Kinzer ................................ 357/23.4 |

OTHER PUBLICATIONS

B. J. Baliga, "Modern Power Devices", John Wiley & Sons, New York (1987), pp. 350-353.

*Primary Examiner*—Edward J. Wojciechowicz
*Attorney, Agent, or Firm*—Ostrolenk, Faber, Gerb & Soffen

[57] ABSTRACT

A lateral conduction high power MOSFET chip with integrated control circuits in disclosed for high-side switching applications. A first surface field reduction region disposed between drain and source regions extends from the chip surface and into its body and has a charge density of about $1 \times 10^{12}$ ions/cm$^2$. A second surface field reduction region extends below the first region and the source and drain regions and has a charge density of from about $1.5 \times 10^{12}$ to $2.0 \times 10^{12}$ ions/cm$^2$. A substrate extends below the second region and is isolated from both drain and source regions to enable the use of the device as a high-side switch.

19 Claims, 5 Drawing Sheets

HIGH POWER MOSFET AND INTEGRATED CONTROL CIRCUIT THEREFOR FOR HIGH-SIDE SWITCH APPLICATION

This is a division of application Ser. No. 07/054,627, filed May 27, 1987, now U.S. Pat. No. 4,866,495 issued 9-12-29.

BACKGROUND OF THE INVENTION

This invention relates to power MOSFETs, and more specifically relates to a novel structure for a power integrated circuit wherein both the drain and source regions can be placed at high voltage relative to the chip substrate to enable its use as a high-side switch.

Power integrated circuits are known in which a power MOSFET and signal processing circuit for controlling the power MOSFET are integrated into the same chip. Such power integrated circuits are used in low-side switching applications. By "low-side switching" is meant an application in which the MOSFET source is held to about the same potential as the chip substrate while the drain can be at relatively high potential relative to the substrate, typically 100 volts or more. The integrated control circuit typically may be a CMOS-type circuit operated at low voltage, for example 15 volts or less relative to the substrate. This control circuit is easily integrated into the substrate which is at ground potential.

There are many applications for power semiconductor switching devices which put the semiconductor device on the high-side. In those circuit applications, the semiconductor switch is connected between the high voltage input potential and the load. Consequently, both the source and drain electrodes of the power MOSFET component will be placed at high or line potential. In applications where the line potential is above 200 volts, it has been impossible to integrate a grounded control circuit into the same substrate since the substrate can be only 100 volts or less from the source. If the source is greater than about 100 volts higher than the substrate, avalanche, punch through breakdown, or pinch-off would occur when the MOSFET device is turned on. The integrated circuit components, however, are conventionally low voltage MOSFET parts which must be near ground potential to communicate with the rest of the circuit which is off the chip. Consequently, discrete power MOSFETs with separate, off chip controls are used in high-side switching applications.

SUMMARY OF THE INVENTION

In accordance with the present invention, a novel lateral conduction power MOSFET is provided for high-side switching application, employing two surface field reduction layers atop one another of respective controlled charge densities to insure field stress reduction at the surface of the chip when the device is off, and to insure high voltage isolation of the source region from the substrate of the chip when the device is on while still having sufficient undepleted charge to permit load current conduction. A low voltage circuit can be integrated into the substrate, and is arranged to shift its potential level with the shift in source voltage from low voltage in the device off condition to high voltage in the device on condition.

More specifically, in accordance with the invention, a first surface field reduction region is formed atop a substrate. The charge contained in the first region (charge density) is from $1.5 \times 10^{12}$ to $2.0 \times 10^{12}$ ions/cm$^2$. A drain region of the same conductivity type and a laterally spaced body region (sometimes called a base or channel region) of opposite conductivity type are formed in the first surface field reduction region. A source region is formed in the channel region to define a channel which can be inverted by a gate electrode spaced above the channel.

A second surface field reduction region of the opposite conductivity type to the first is then formed, as by implantation and drive, in the surface of the first field reduction region and is disposed laterally between the body and drain regions. The second surface field reduction region has a charge density of about $1 \times 10^{12}$ ions/cm$^2$.

This novel structure permits the use of the chip for high-side switching for two reasons. First, the body region and source region can be placed at about line potential, for example, up to 600 volts, relative to the grounded substrate. Second, the body and source can be close to the substrate potential and still withstand 600 volts relative to the drain region. The reason for this is the following: The first surface field reduction region, disposed vertically between the second field reduction region and substrate, has a charge density (for example, $2 \times 10^{12}$ ions/cm$^2$) to cause it to fully deplete prior to avalanche because it is depleted from its top by the second region, and from the bottom by the substrate. The upper second surface field reduction region is tied to a potential close to that of the body region. That is, the body to drain junction, when depleted, punches through to the second surface field reduction region to fix its potential close to that of the body region. However, when both the body and drain regions are at high voltage relative to the substrate (the device is turned on), the first surface field reduction region depletes only from one side. The charge density of $2 \times 10^{12}$ ions/cm$^2$ is high enough in this case to prevent full depletion and prevents punch through breakdown from the body region to the substrate as well as providing sufficient undepleted charge to form a low resistance conduction path from source to drain through the first lateral surface field reduction region.

The use of a surface field reduction region is known and is described in a paper entitled "High Voltage, High Current Lateral Devices" by H. M. V. Vaes and J. A. Appels, IEDM 1980, pp. 87–90.

The reference however does not disclose the application of the surface field reduction theories to high-side power MOSFETs.

An integrated control circuit such as a 15 volt CMOS-type circuit is integrated into the same chip substrate to control the gate of the power MOSFET device. The CMOS control circuit can include one or more sections integrated into one or more regions of the substrate which are appropriately isolated from the main power structure. An appropriate level shift circuit is employed to shift gate voltage level with the source electrode voltage.

In a first embodiment of the invention, current flows in a path extending laterally through an inversion channel, then vertically downward and laterally, in the same direction, under the second reduced surface field region toward the drain region.

In a second embodiment of the invention, the current path from the source is a reentrant path, having a first lateral component in one direction, a vertical component and then a lateral path extending in an opposite direction under the body and toward the drain region. This later embodiment increases ruggedness since avalanche current does not flow under the source region so that the parasitic NPN region does not become active.

The same basic silicon structure can also be used to form a high-side or low-side high voltage P-channel device, a high-side or low-side P channel insulated gate bipolar transistor and a low-side N-channel insulated gate bipolar transistor. In a still further embodiment, the invention permits the implementation of a monolithic high voltage bridge circuit consisting of the combination of a PMOS insulated gate bipolar transistor and an NMOS insulated gate bipolar transistor.

DESCRIPTION OF THE PREFERRED EMBODIMENTS

As stated previously, the present invention makes it possible to integrate low voltage control circuitry into the same chip which contains a power MOSFET section in which both source and drain regions may swing to high potential. To illustrate applications in which this can occur and to better define the terms "low-side switching" and "high-side switching", examples of the two are shown in FIGS. 1 and 2, respectively.

Figure 1:
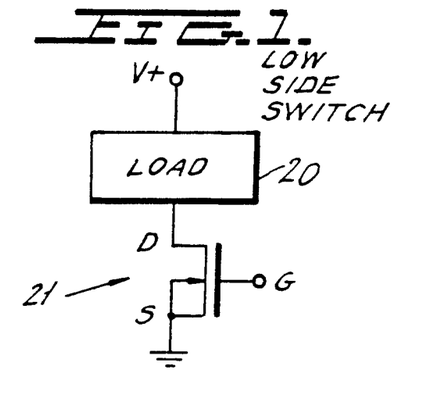
FIG. 1 is a circuit diagram of a prior art low-side switch.
Figure 2:
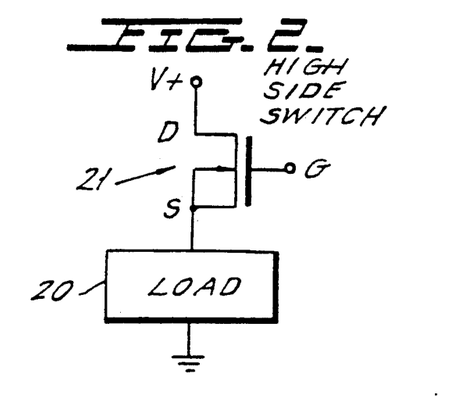
FIG. 2 is a circuit diagram of a prior art high-side switch.

In the low-side switch of FIG. 1, a load 20 is connected between a source of voltage V+ and a power MOSFET 21. The power MOSFET 21 contains a conventional drain electrode, source electrode and gate electrode identified by the letters D, S and G, respectively. The power MOSFET 21 may be an N channel enhancement-type device. The drain is connected to the load 20 and the source is connected to low potential or ground. In order to apply power to the load, the power MOSFET 21 is turned on by applying a suitable potential, for example 10 volts above ground to the gate electrode. The device then conducts and the potential of the drain drops from about the voltage V+ to a relatively small voltage above the source voltage. Thus, in the low-side switch of FIG. 1, the source electrode remains at about ground potential and only the drain electrode rises to high voltage.

The source electrode in the power MOSFET 21 is connected to the chip substrate. Therefore, it is possible, if desired, to integrate a low voltage control circuit into the same substrate, and isolate it from the power section. Such power integrated circuits are known. Such devices, however, cannot be used in high-side switch applications such as that of FIG. 2. In FIG. 2, the high-side switch circuit is shown in connection with the load 20 and same power MOSFET 21 of FIG. 1. When a voltage is applied to the gate electrode, which is about 10 volts higher than the voltage of the source, the MOSFET turns on. When it turns on, the source voltage rises to a value close to that of the voltage V+. Thus, in the arrangement of FIG. 2, both the drain and source electrodes are at high potential. Since the source is customarily connected to the substrate, the substrate will swing to high potential. Consequently, low voltage control circuitry cannot be integrated into the same substrate which carries the power MOSFET 21 since it cannot be easily insulated from off-the-chip input circuits.

As will be seen, the present invention provides a novel power section for a power integrated circuit in which both drain and source regions are isolated from the substrate so that the substrate can be at low potential, even though both drain and source regions are driven to high potential in a high-side switch application Since the substrate is at low potential, low voltage control circuitry can easily be integrated into the same substrate.

Figure 3:
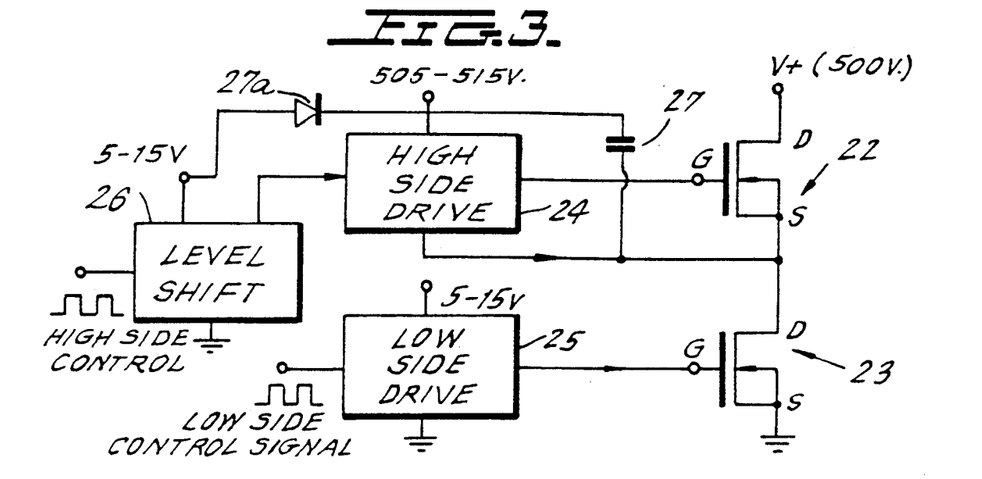
FIG. 3 is a circuit diagram of a prior art bridge driver with the control components shown in block diagram form.

FIG. 3 shows a typical application which employs both a high-side switch and a low-side switch for a half-bridge power output, which is well known to those skilled in the art. Thus, FIG. 3 shows two power MOSFETs 22 and 23, each identical to power MOSFETs 21 of FIGS. 1 and 2, but connected in series to form one-half of a full wave bridge. A first drive circuit 24, termed a high-side drive, is connected to the gate electrode of MOSFET 22 while a second drive circuit 25, termed a low-side drive, is connected to the gate electrode of power MOSFET 23. A level shift circuit 26 is connected to the high-side circuit 24 to shift the gate drive from the ground referenced input level to a floating source-referenced level. This level shift was conventionally done using discrete high voltage components or an isolation transformer.

The output voltage to the gate of high-side MOSFET 22 is from 505 to 515 volts for an application in which V+ is, for example, about 500 volts. A bootstrap capacitor 27 is employed to provide a voltage to drive the gate which is at a voltage higher than that of the source of device 22. A diode 27a charges the bootstrap capacitor 27 to the low voltage supply level when the source of MOSFET 22 swings to ground. When the source swings high, the capacitor 27 then swings with it. The output voltage of the low-side drive circuit 25 should be in the range of 5 to 15 volts in order to control the low-side MOSFET 23. It is possible to integrate the low-side drive circuit 25 into the chip substrate containing the power MOSFET section 23 since the substrate and the source region are at ground voltage. However, the source and substrate of the high-side MOSFET 22 will rise to approximately the 500 volts of the voltage source V+ so that low voltage drive circuitry cannot be integrated into that substrate. As a result, bridge drivers such as that of FIG. 3 are commonly made in hybrid fashion with discrete power MOSFETs for the MOSFETs 22 and 23 and separate circuits 24 and 25 for their control.

Figure 4:
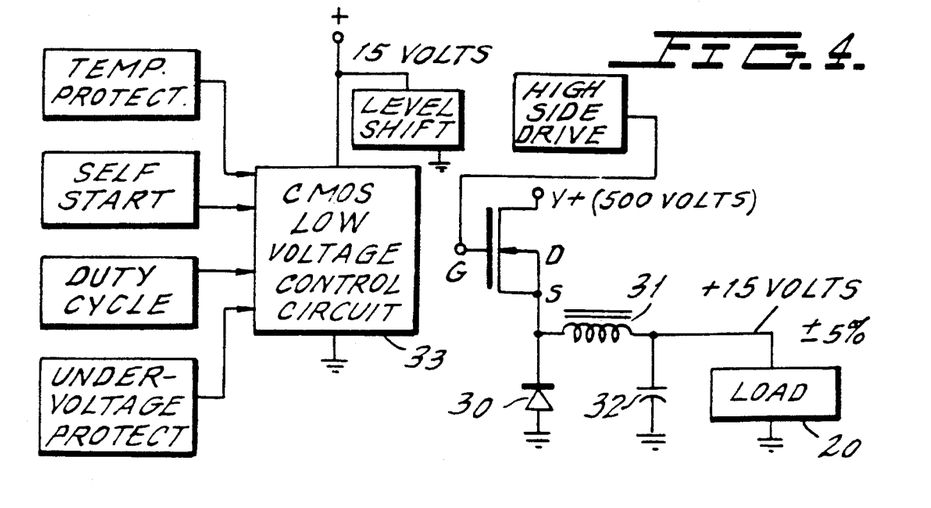
FIG. 4 is a circuit diagram of a well-known prior art buck converter circuit with its control components shown in block diagram form.

FIG. 4 is another example of a high-side power MOSFET application. Thus, FIG. 4 shows a buck converter of well-known configuration in which a power MOS- FET 21 is connected in the high-side fashion of FIG. 2 between a voltage source V+, which may be 500 volts, and the load 20. In the buck converter circuit, there is also provided a diode 30 and a filter consisting of the choke 31 and capacitor 32. A low voltage drive circuit 33 is coupled to the gate of MOSFET 21 to control the conduction of the power MOSFET 21 as will be described. The control circuit may be a CMOS-type circuit operated, for example, at 15 volts. It may include functions of temperature protection, self-start, duty cycle control, under voltage protection and any other function desired for the control circuit of a typical converter. All of these can be integrated into the low voltage control 33.

The output of the brick converter may, for example, be 15 volts ±5% and the current output may be up to about 1 ampere. These converters are operated in such a manner that the power MOSFET 21 is turned on and off with a given duty cycle so that, when it conducts, current flows to the load 20 through the choke 31 for a given period, which is adjustable, from the output of the device to maintain a constant output voltage. At the end of the period, the power MOSFET 21 is turned off but current will continue to flow through choke 31 and through the diode 30, which is a freewheeling diode. The magnitude of the output voltage connected to the load 20 is a function of the duty cycle. By way of example, if the input voltage is 300 volts and the output voltage is 15 volts, the duty cycle should be set at about 5%. Such circuits operate with an efficiency of from 60-70%.

In the past, it has been impossible with conventional power MOSFETs to integrate the CMOS control circuitry 33 of FIG. 4 into the substrate of the power MOSFET 21. This is because the substrate is at the potential of the source and in the circuit of FIG. 4, both drain and source rise to approximately the full voltage V+ of the input circuit.

As hereinafter described, the novel invention provides a power MOSFET section in which both source and drain regions are isolated from the substrate of the chip so that the substrate can be at ground potential relative to both drain and source regions in high voltage applications (those in which the line voltage is greater than about 200 volts). Consequently, the control circuit 33, which is a low voltage control circuit, can be integrated into the same substrate to make a novel power integrated circuit for high-side switching.

Figure 5:
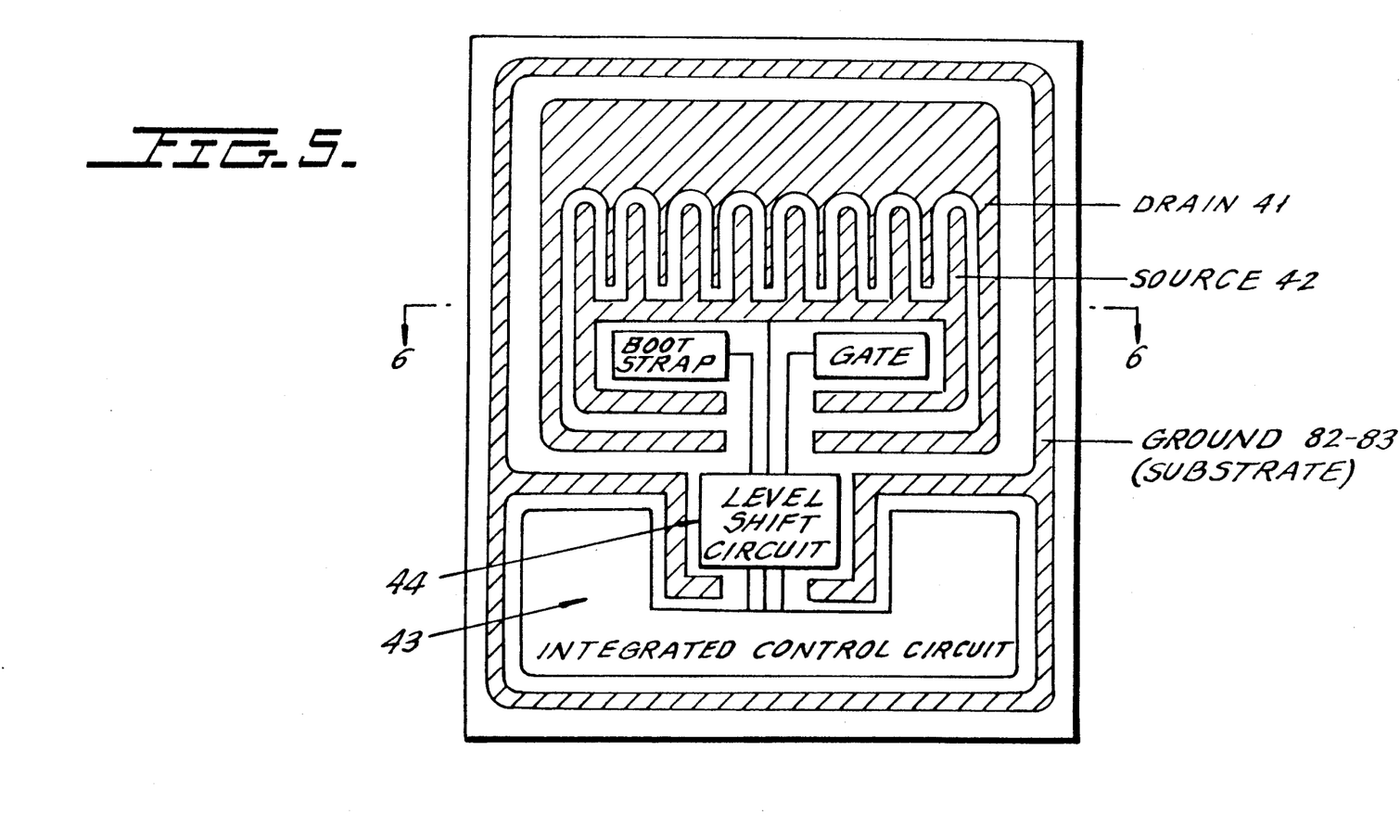
FIG. 5 is a top plan view greatly enlarged and in schematic form of a chip which employs the novel invention with the drain and source electrodes shown in interdigitated form.
Figure 6:
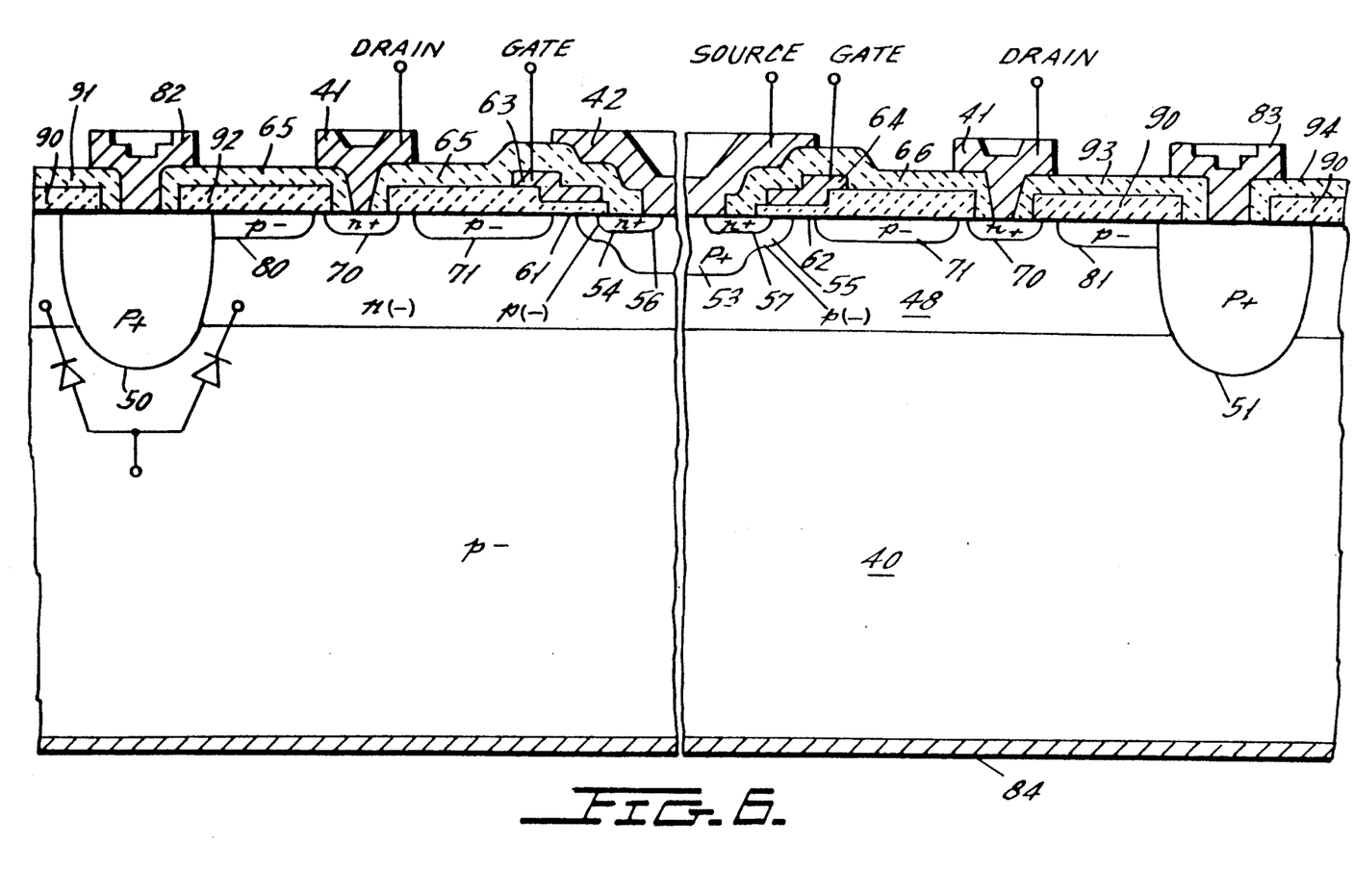
FIG. 6 is a cross-sectional view of a portion of FIG. 5 taken across section line 6—6 in FIG. 5.

One embodiment of the novel device of the invention is shown in FIGS. 5 and 6. FIG. 5 schematically illustrates one geometry which a power integrated chip 40 can assume More specifically, the arrangement of FIG. 5 shows the power integrated circuit as employing an interdigitated geometry for the drain electrode 41 and source electrode 42. These are illustrated in schematic fashion and it will be understood that a large number of interdigitated fingers may be used, for example 20. Other geometries can be employed to carry out the present invention, as will become apparent from the description of FIG. 6.

Any desired integrated control circuit can be integrated into the chip 40 This low voltage integrated control circuit is schematically illustrated as the circuit 43 in FIG. 5 which is electrically insulated from the other circuits and from the power device source and drain Also shown in schematic form is a high voltage level shift and drive circuit 44 for the power FET gate, which must swing above the line voltage to maintain conduction in the power device. Since the chip or substrate 40 is always connected to the lowest, or ground potential, it remains possible to integrate low voltage control circuitry into the substrate 44.

FIG. 6 illustrates the novel junction patterns which are employed in the chip of FIG. 5 shown for the three fingers which are viewed from the section line 6—6 in FIG. 5.

Referring now to FIG. 6, the main chip substrate is the P(−) substrate 40. The P(−) substrate 40 has an epitaxial N(−) layer 48 deposited thereon which receives the various junctions of the novel lateral conduction power MOSFET. Layer 48 is the first reduced surface field region of the invention, referred to above, and has a charge density of from $1.5 \times 10^{12}$ to $2 \times 10^{12}$ ions/cm$^2$, preferably $2.0 \times 10^{12}$ ions/cm$^2$.

In the section shown in FIG. 6, there are shown deep P(+) isolation regions to isolate the power section illustrated in FIG. 6 from integrated control sections formed on the same chip and within the same epitaxially deposited region 48 as receives the power section.

A body region 53 is formed in the layer 48 having the characteristic deepened P(+) central body portion which improves blocking voltage and prevents turn-on of parasitic bipolar transistors. Body region 53 is sometimes termed a base region, due to the parasitic NPN transistor inherent in the structure. The P(+) body region extends bilaterally to lower conductivity P(−) regions 54 and 55. A pair of N(+) source strip regions 56 and 57 are formed in the body region 53, which are self-aligned to the shallow P(−) shelf regions of P(+) base region 53. The space between the outer edges of source regions 51 and 59 and the outer edges of regions 54 and 55 define surface channels which can be inverted by an appropriate gate structure.

A source electrode 42 is connected at the surface of the chip to source regions 56 and 57 and the center of the channel region 53. Surface channels 54 and 55 have overlying gate oxide layers 61 and 62, respectively, and conductive polysilicon electrodes 63 and 64 lying atop the gate oxide regions 61 and 62. Silox (phosphorous doped silicon dioxide) layer 65-66 overlies the gate oxides 61 and 62 and the field oxides extending therefrom to complete the source and channel structure.

Two drain electrodes 41 are symmetrically laterally spaced from the central source 42. Each of drains 41 are electrically connected to N(+) diffusions or drain regions 70 in the layer 48.

In accordance with an important feature of the invention, two P(−) reduced surface field regions 71 are formed in first reduced surface field region 48 between the channels 54 and 55 and respective ones of drain strips 70. Regions 71 each have a charge density preferably of $1 \times 10^{12}$ ions/cm$^2$. The lateral space between regions 53 and 71 must be small, preferably less than 10 microns, and well controlled. Too small a space pinches off the available conduction space. Too large a space produces premature avalanche. The space may vary between 2 to 8 microns and is preferably 5 microns.

The structure of the chip of FIG. 6 is completed by P(−) regions 80 and 81 which extend from the junction isolations 50 and 51. Substrate electrodes 82 and 83 are connected to the P(+) diffusions 50 and 51 and are at the same potential as the substrate electrode 84 on the bottom of the chip 40. P(−) regions 80 and 81 insure proper lateral distribution of the electric field from the drain regions 70 to the grounded electrodes 82 and 83. Field oxide 90 overlies regions 80 and 81, and silox strips 91, 92, 93 and 94 (which are segments of a common strip) are applied as shown.

The structure of the novel power section of FIG. 6 enables the integration of low voltage control, high voltage level shift, and gate drive circuits into the same substrate which contains the power section. The control components are integrated into the low voltage substrate 48 at some region isolated from the power section as shown in FIG. 5. Consequently, the novel power integrated chip of FIGS. 5 and 6 can be employed in a high-side switching application. Obviously, the same technology could be used for general power MOSFET application, but its uniqueness lies in its ability to perform high-side switching, since both source and drain regions can be operated at high voltage relative to the substrate 40.

The device of FIGS. 5 and 6 is an N channel enhancement type of device having both vertical and lateral components for the current conducting path. In operation, when the device is to be turned on, a suitable voltage, for example from 0–10 volts, is applied to the polysilicon gate electrodes 63 and 64. This inverts the surface channels 54 and 55 and enables a current conduction path from drain regions 70 under the P(−) regions 71 and then vertically up through the region between the body region 53 and the adjacent sides of the regions 71 and through the surface channels 54 and 55 to the source regions 56 and 57 and to the source electrode 42.

In a high-side switch application, drain electrode 70 may be connected directly to a voltage source which is at about 500 volts in a circuit typically of the type shown in FIG. 4. The source 42 may be connected directly to a load. When the power MOSFET section turns on, the source will swing to approximately the 500 volts of the drain minus the voltage drop in the drain-to-source current path through the substrate 48. The control circuit for turning the device on can be a 15 volt CMOS circuit such as that of circuit 43 in FIG. 5, integrated directly into a junction-isolated region of epitaxial layer 48 which is only 15 volts above ground potential. The output of this circuit must then be translated across the 500 volts by means of a level shifter to raise the gate above the drain potential.

Operation of Device of FIG. 6

The manner in which the reduced surface regions 48 and 71 cooperate to enable the use of the device for high-side switching application is as follows:

Assume first that the device is "on". In that case, the drain regions are at line voltage, for example, 500 volts, and the source regions 56 and 57 are at 500 volts minus the voltage drop produced by the resistance between drain and source. A depletion region then spreads from the P(−) substrate 40 only. As is well known, the charge which will be depleted on each side of any junction in silicon when the critical field is reached is approximately $1 \times 10^{12}$ ions/cm$^2$. At 500 volts, the depletion region does not reach the bottom of body region 53 and an undepleted layer having a charge concentration of $1 \times 10^{12}$ ions/cm$^2$ remains between the depletion region extending from P(−) substrate 40 and the bottoms of regions 53 and 71 to define lateral conduction paths to drains 70 beneath regions 71. No punch through occurs from body region 53 to P(−) substrate 40 since the depletion region does not reach the region 53. Thus, the source can be at high voltage relative to the substrate when the device is on. Note that the structure in the on condition resembles a lateral JFET consisting of P(−) region 40, N(−) region 48 and P(−) regions 71, pinched only from the bottom P(−) region 40.

Consider next the device of FIG. 6 with the gate voltage removed and the device in the "off" state. Sources 56 and 57 and the substrate are at about ground potential while the drain regions 70 are at line potential, which may be 500 volts. The first reduced surface field region 48 is now depleted from both sides; from the P(−) substrate 48, and the P(−) regions 71. Thus region 48 fully depletes $1 \times 10^{12}$ ions/cm$^2$ from both sides, for a total of $2 \times 10^{12}$ ions/cm$^2$. Similarly, P(−) regions 71 are fully depleted, causing field reduction at the surface of the device and close to avalanche conditions at the junction between P(−) substrate 40 and layer 48.

More specifically, the N(−) region 48 depletes from P(+) region 53 toward the P(−) regions 71. At a fairly low voltage, the depletion reaches regions 71, thus setting their potential near that of region 53. With this accomplished, depletion begins at the junction between regions 71 and 48, while also occurring at the junction between the region 48 and substrate 40. The total dose in regions 71 and 48 is tailored so that both are fully depleted just before the critical field is reached at the junction between P(−) substrate 40 and N(−) epi layer 48. Therefore, surface fields are reduced near blocking junctions so that critical field is reached in the silicon bulk before it is reached at the surface.

The P(−) regions 71 and 48 permit the use of lower resistivity epitaxial material while retaining a high blocking voltage. Thus, for a given device, on resistance is lower.

FIGS. 7–12 illustrate a process by which the novel device of FIG. 6 can be made. As was the case in FIG. 6, all dimensions are greatly distorted in order to better illustrate the novel features of the invention.

Figure 7:
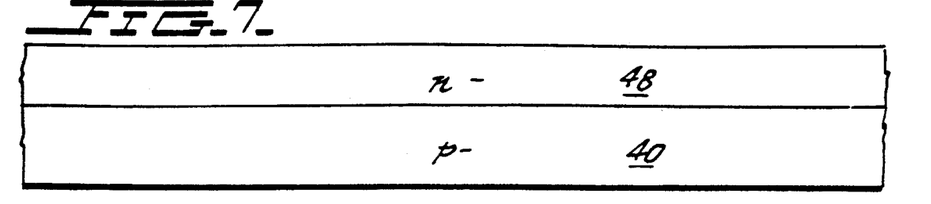
FIGS. 7-12 show a semiconductor wafer in exaggerated dimensional form for clarity to illustrate the steps of manufacture of the device shown in FIGS. 5 and 6.
Figure 8:
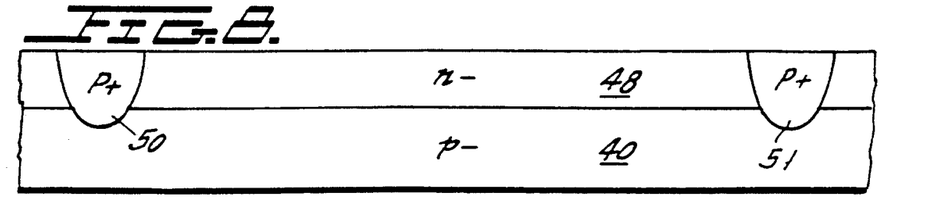

FIG. 7 shows the starting wafer for the device as a P(−) substrate which can, for example, be 25 mils thick and have a 25 ohm centimeter resistivity. A plurality of chips are conventionally made at one time, for example in a 5 inch diameter wafer. A phosphorus doped N(−) epitaxial layer 48 which has a thickness of 20 microns and a resistivity of 2.6 ohm centimeters is formed on the substrate 40 by appropriate epitaxial techniques.

The wafer of FIG. 7 is first suitably cleaned and is oxidized with a silicon oxide coating of about 5,000 Angstroms in thickness. The oxide coating is then masked and etched to form windows which enable the formation of the P(+) isolation regions 50 and 51 shown in FIG. 8. Isolation rings 50 and 51 have a depth of about 25 microns and may be formed with a boron diffusion for about 16 hours at 1,200° C. and until the surface resistivity is about 10 ohms per square.

Figure 9:
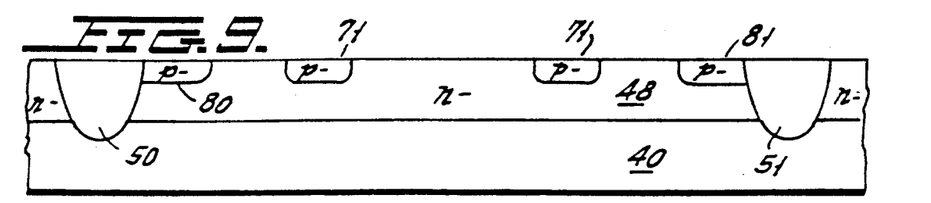
Figure 10:
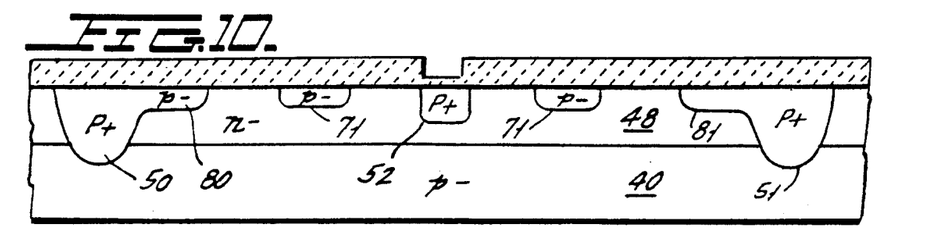

Thereafter, and as shown in FIG. 9, a second mask and etch step is carried out to produce the reduced surface field implant of regions 71, 80 and 81. This is carried out with a boron implant with a total dose of about $5 \times 10^{12}$ followed by a drive for about 5 hours at 1,200° C. At the end of the drive, the sheet resistivity should be about 10,000 ohms per square and the depth of the P(−) regions 71 should be about 5 microns.

Thereafter, a field oxide 110 is grown to a thickness of about 1.1 microns. Some of the boron implant will be lost into this oxide. Whatever process is used for the formation of the resurf region 71, in the preferred embodiment of the invention, the final charge in these regions should be about $1 \times 10^{12}$ ions/cm$^2$. Oxide 110 is then masked and etched and a boron implant is carried out to form the P(+) region 52 which will become the deepened part of the body 53 of FIG. 6. The boron implant used in this step has a dose of $3 \times 10^{14}$ followed by a boron drive for two hours at about 1,050° C.

Thereafter, a fourth masking step is carried out in which oxide is removed from the active areas. That is, oxide is removed from the areas between P(−) regions 80 and 70 on one side and 70 and 81 on the other side and the area between the facing edges of resurf regions 70. Thereafter, a gate oxidation step takes place growing a gate oxide of 800 Angstroms in thickness, followed by the deposition of polysilicon.

Figure 11:
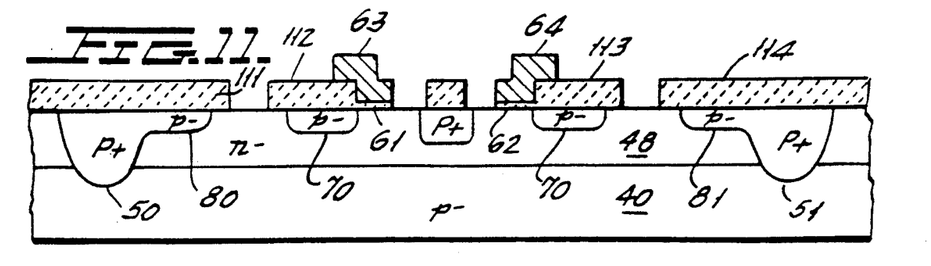

A polysilicon etch and oxide etch are carried out in a fifth masking step to form the structure shown in FIG. 11. Thus, in FIG. 11, there is shown gate oxide segments 61 and 62, polysilicon gates 63 and 64, and the field oxide strips 111 through 114, which are segments of a common oxide sheet which has been etched.

In a sixth masking step, a photoresist implant mask is formed to enable the forming of a body region to define the channel regions 54 and 55. Thus, a boron implant having a dose of $7 \times 10^{13}$ with a diffusion drive for about 60 minutes at 1,175° C. is used. The wafer is then oxidized to add about 1,800 Angstroms to the oxide coating.

Figure 12:
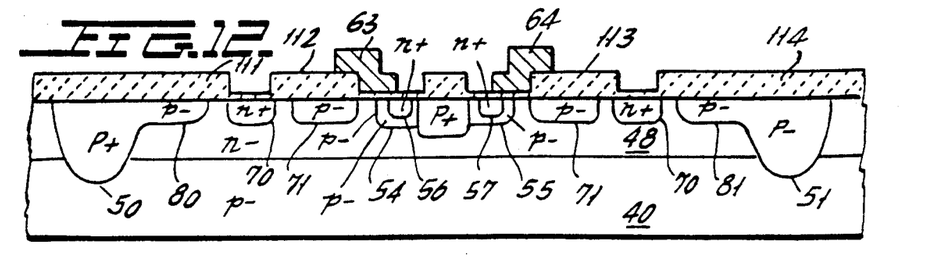

The N(+) source regions 56 and 57 are then formed by a mask and etch step followed by an arsenic implant having a dose of $5 \times 10^{15}$ followed by a drive for two hours at 975° C. to form the N(+) channels 56 and 57 shown in FIG. 12.

Thereafter, an appropriate interlayer dielectric is applied to the device of FIG. 12 resulting in the structure shown in FIG. 6. Thereafter, a contact mask etch step is carried out to expose the contact regions and one micron of aluminum is deposited over the etched pattern.

A ninth mask step is carried out to perform the necessary aluminum etch to define the contact pads followed again by a silox scratch protection deposition. A final and tenth mask is employed to carry out a silox etch.

Figure 13:
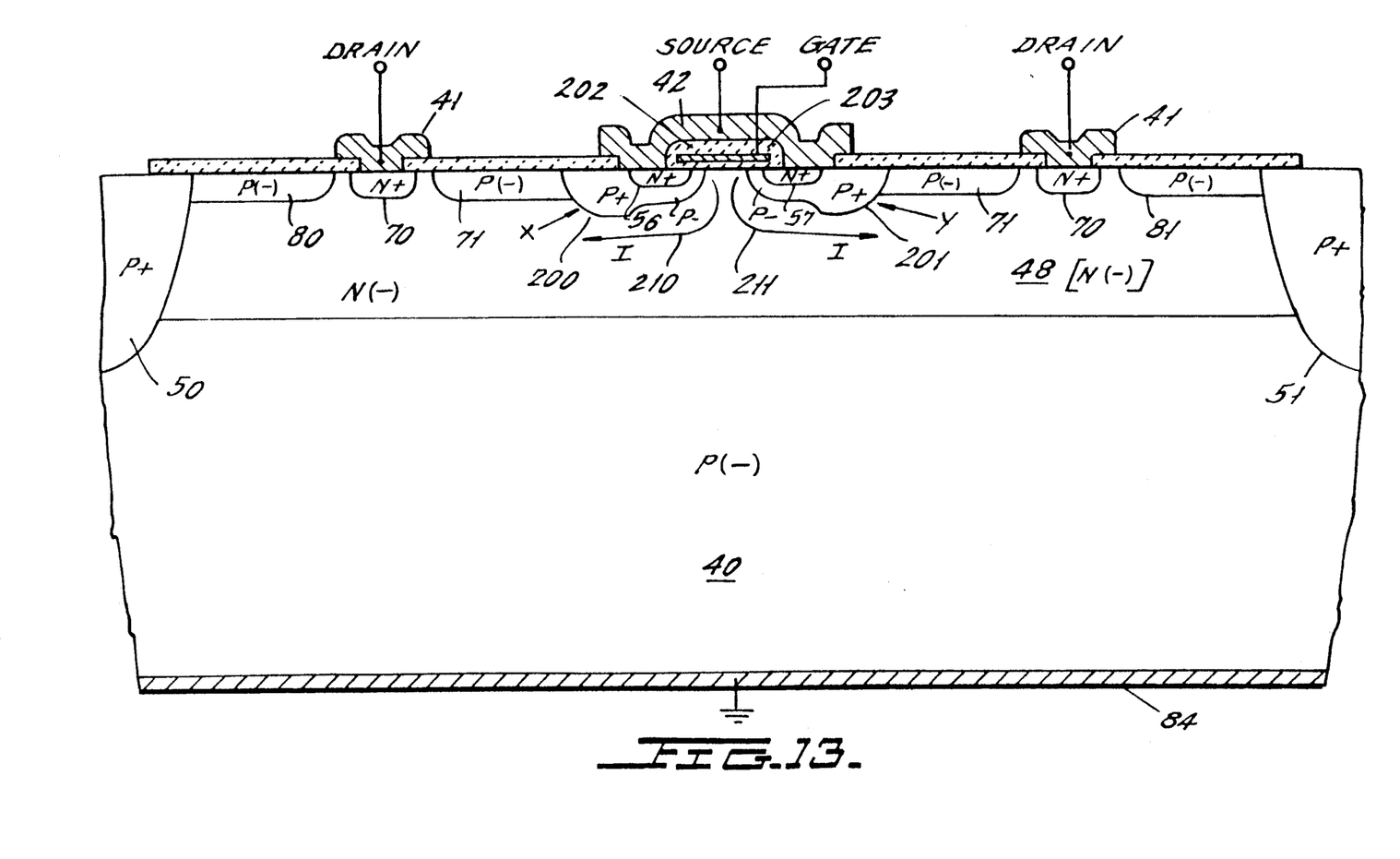
FIG. 13 is similar to FIG. 6, but shows a second embodiment of the invention.

FIG. 13 shows a cross-sectional view of the junction pattern of a second embodiment of the invention. The device of FIG. 13 is carried out with a topology similar to that shown in FIG. 5 and is a cross-sectional view similar to that of FIG. 6.

The device of FIG. 13 differs from that of FIG. 6 in having a modified lateral current path to the drains which, as will be later described, avoids flow of avalanche current beneath the N(+) sources so that the parasitic NPN bipolar transistor does not become active. This enhances the ruggedness of the device. Another advantage of the structure of FIG. 13 over that of FIG. 6 is that the gate oxide does not extend over the drain drift region and step up onto a field oxide.

In the following description of FIG. 13, those components which are essentially identical to those described in FIG. 6 have been given the same identifying numerals. Moreover, the novel use of two reduced surface field regions 48 and 71 of differing charge concentrations is retained to obtain the benefits described previously which permit the use of the device in high-side switching applications.

The body region 53 of FIG. 6 is carried out in the embodiment of FIG. 13 as two separate spaced channel regions 200 and 201, respectively. Each has a deepened P(+) region and a shallower P(−) region in which the inversion channel is defined by the source regions 56 and 57, respectively. In view of this revision, it is now possible to employ a flat simple gate oxide layer 202 beneath the polysilicon gate 203. Thus, the processing of the device is simpler than that of the device of FIG. 6.

The configuration of the gate in FIG. 13 helps reduce drift of the device characteristics, particularly avalanche value and device stability, over time. Thus, in the embodiment of FIG. 6, there is a high field which can cause trapped charges in the gate region which changes the field distribution within the silicon and consequently changes avalanche voltage. This condition is substantially negated in the embodiment of FIG. 13 by reducing the high fields at the gate oxide.

A major advantage is obtained in FIG. 13 by the separation of the body regions into two separate regions 200 and 201. This structure modifies the current path from the inversion channels in the P(−) regions to the left hand and right hand drains 70 respectively. These current paths are shown by the arrows 210 and 211 respectively which show current paths with re-entrant bends. With this type structure, avalanche current, which will flow in the regions marked X and Y respectively, does not flow beneath the N(+) source regions 56 and 57. Consequently, the parasitic NPN bipolar transistors consisting of source 56, the P(−) region of base 200, and the region 48; and source 57, the P(−) region of base 201 and region 48; do not turn on or become active. Consequently, the device has increased ruggedness as compared to that of FIG. 6.

The reduced field regions 71 of FIG. 6 are are also in the device of FIG. 13 and carry the same identifying numeral, although in the embodiment of FIG. 13 regions 71 contact on about the P(+) channel regions 200 and 201 respectively. Their functions, however, are identical to those described in connection with FIG. 6.

In the manufacture of the embodiment of FIG. 13, the P(−) substrate 40 was monocrystalline silicon having the resistivity of 25 ohms/cm for a device which was to have a 550-600 volt breakdown. The N(−) region 48 was a 2.5 ohms/cm material having a thickness of about 20 microns. P(−) regions 71, 80 and 81 each had a depth of about 3 microns. The P(+) regions 200 and 201 had a depth of 4 microns at their deepest point and about 3 microns at their shallower shelf region. The spacing between adjacent channel regions 200 and 201 is preferably about 5 microns. The width of each of regions 200 and 201 is about 8 microns, and the width of each of P(−) regions 71, 80 and 81 was about 50 microns. Each of drain regions 70 has a depth of about 0.8 microns and a width of from 5-15 microns. The drain regions 70 are spaced from their adjacent P(−) regions 71 by a gap of about 214 3 microns. When forming the regions 71, an ion implant dose of about $5 \times 10^{12}$ is employed. This dose is reduced down to about $1 \times 10^{12}$ by later steps in which oxides are grown and due to compensating N-type charge. The P(−) regions of channel regions 200 and 201 are formed by an ion implant using a dose of about $7 \times 10^{13}$. The gate oxide 202 has a thickness of about 800 angstroms.

Another advantage of the embodiment of FIG. 13 is that the space between channel regions 200 and 201, which is about 5 microns becomes fully depleted when the device is in its blocking condition. Therefore, no high electric field stress will appear in the region near the edge of the polysilicon gate 203. Consequently, no avalanche will occur in that very critical region.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A power integrated circuit integrally including a power MOSFET and an electrically-isolated control circuit for controlling the switching state of said power MOSFET;

said power MOSFET being for placement on the high potential side of a load;

said control circuit being formed in the power integrated circuit atop a substrate of monocrystalline semiconductor material;

said power MOSFET also being formed atop said substrate, being electrically isolated from said control circuit, and including a first layer of a first conductivity type formed atop said substrate, defining a reduced surface field first region, and having top and bottom surfaces; a surface-adjoining body region of a second conductivity type formed in said first layer and comprising first and second laterally-spaced segments; a surface-adjoining source region of said first conductivity type formed in said first layer and having first and second segments respectively within said first and second body region segments; said first and second source region segments spaced from confronting edges of said first and second body region segments respectively and defining respective first and second surface channel segments at said top surface of said first layer; the laterally-outwardly spaced portions of said first and second body region segments respectively adjoining said first and second source region segments and having a substantially greater conductivity than the adjacent laterally-inwardly spaced portions of said first and second body region segments for suppressing parasitic bipolar transistor turn-on; a gate oxide and gate electrode formed atop said surface channel; a drain region of said first conductivity type formed in said first layer and comprising first and second laterally-spaced segments spaced laterally outwardly of said first and second body region segments; a second region of said second conductivity type formed in said first layer and comprising a first segment interposed between said first body region segment and said first drain region segment and defining a reduced surface field region segment and a second segment interposed between said second body region segment and said second drain region segment and defining a reduced surface field region segment, whereby current flow from said surface channel has a vertical component from said surface to a depth greater than the depth of said second region, and first and second lateral components respectively beneath said first and second segments of said second region; said first region having a total charge approximately equal to the charge which will be depleted from both the top and bottom of said first region when said device is off; said second region having a total charge of approximately $1 \times 10^{12}$ ions/cm$^2$.

2. The power integrated circuit of claim 1, including junction-isolation means to electrically isolate said control circuit from said power MOSFET.

3. The power integrated circuit of claim 1, further integrally including a gate-voltage-level-shift circuit connected to said control circuit to boost a control voltage produced from said control circuit to that necessary to control the power MOSFET when the same is connected to a high potential side of a load. v 4. The field effect transistor of claim 1, which further includes source and drain electrodes; said source electrode connected to said base and source regions; said drain electrode connected to said drain region.

5. The field effect transistor of claim 1, wherein said second region has a depth about equal to or greater than the depth of said drain region and a depth greater than the depth of said source region.

6. The field effect transistor of claim 1, wherein said substrate is of the second conductivity type.

7. The field effect transistor of claim 1, wherein said total charge in said first region is from $1.5 \times 10^{12}$ ions/cm$^2$ to $2 \times 10^{12}$ ions/cm$^2$.

8. The field effect transistor of claim 1, wherein the respective first and second segments of said body, source and drain regions are elongated and parallel.

9. The field effect transistor of claim 1, wherein both of said source and drain regions can reach a potential of greater than about 100 volts above substrate potential during operation.

10. The device of claim 1 wherein said gate electrode is a polysilicon gate disposed in a single flat plane.

11. A monolithic high voltage bridge circuit comprising first and second insulated gate bipolar transistors that are interconnected for being on the high and low potential sides of a load, respectively;

each transistor comprising a portion of a substrate of monocrystalline semiconductor material; a first layer of a first conductivity type formed atop said substrate, defining a reduced surface field first region, and having top and bottom surfaces; a surface-adjoining body region of a second conductivity type formed in said first layer and comprising first and second laterally-spaced segments; a surface-adjoining source region of said first conductivity type formed in said first layer and having first and second segments respectively within said first and second body region segments; said first and second source region segments spaced from confronting edges of said first and second body region segments respectively and defining respective first and second surface channel segments at said top surface of said first layer; the laterally-outwardly spaced portions of said first and second body region segments respectively adjoining said first and second source region segments and having a substantially greater conductivity than the adjacent laterally-inwardly spaced portions of said first and second body region segments for suppressing parasitic bipolar transistor turn-on; a gate oxide and gate electrode formed atop said surface channel; a drain region of said first conductivity type formed in said first layer and comprising first and second laterally-spaced segments spaced laterally outwardly of said first and second body region segments; a second region of said second conductivity type formed in said first layer and comprising a first segment interposed between said first body region segment and said first drain region segment and defining a reduced surface field region segment and a second segment interposed between said second body region segment and said second drain region segment and defining a reduced surface field region segment, whereby current flow from said surface channel has a vertical component from said surface to a depth greater than the depth of said second region, and first and second lateral components respectively beneath said first and second segments of said second region; said first region having a total charge approximately equal to the charge which will be depleted from both the top and bottom of said first region when said device is off; said second region having a total charge of approximately $1 \times 10^{12}$ ions/cm$^2$.

12. The bridge curent of claim 11, wherein the first and second transistors respectively constitute PMOS and NMOS devices.

13. The field effect transistor of claim 11, which further includes source and drain electrodes; said source electrode connected to said base and source regions; said drain electrode connected to said drain region.

14. The field effect transistor of claim 11, wherein said second region has a depth about equal to or greater than the depth of said drain region and a depth greater than the depth of said source region.

15. The field effect transistor of claim 11, wherein said substrate is of the second conductivity type.

16. The field effect transistor of claim 11, wherein said total charge in said first region is from $1.5 \times 10^{12}$ ions/cm$^2$ to $2 \times 10^{12}$ ions/cm$^2$.

17. The field effect transistor of claim 11, wherein the respective first and second segments of said body, source and drain regions are elongated and parallel.

18. The field effect transistor of claim 11, wherein both of said source and drain regions can reach a potential of greater than about 100 volts above substrate potential during operation.

19. The device of claim 11 wherein said gate electrode is a polysilicon gate disposed in a single flat plane.

* * * * *

UNITED STATES PATENT AND TRADEMARK OFFICE
CERTIFICATE OF CORRECTION

PATENT NO. : 5,023,678
DATED : June 11, 1991
INVENTOR(S) : Daniel M. Kinzer It is certified that error appears in the above-identified patent and that said Letters Patent is hereby corrected as shown below:

Title page,
Item [*] Notice, should read:
-- This patent is subject to a terminal disclaimer. --.

Signed and Sealed this

Thirty-first Day of January, 2006

JON W. DUDAS
*Director of the United States Patent and Trademark Office*